United States Patent [19]

Podell et al.

[11] Patent Number: 5,015,968

[45] Date of Patent: May 14, 1991

[54] FEEDBACK CASCODE AMPLIFIER

[75] Inventors: Allen F. Podell, Palo Alto; Fazal Ali, Santa Clara; Robert H. Benton, Mountain View, all of Calif.

[73] Assignee: Pacific Monolithics, Sunnyvale, Calif.

[21] Appl. No.: 558,611

[22] Filed: Jul. 27, 1990

[51] Int. Cl.⁵ .............................................. H03F 3/16
[52] U.S. Cl. .................................. 330/277; 330/294; 330/302
[58] Field of Search .............. 330/277, 286, 294, 300, 330/302, 306, 311

[56]     References Cited
U.S. PATENT DOCUMENTS

| | | | |
|---|---|---|---|
| 4,112,386 | 9/1978 | Everhart et al. | 330/311 X |
| 4,342,967 | 8/1982 | Regan et al. | 330/277 |
| 4,658,220 | 4/1987 | Heston et al. | 330/277 |

OTHER PUBLICATIONS

John Wiley & Sons, *Microwave Circuit Design Using Linear and Nonlinear Techniques*, pp. 250 and 252, 1990.

Primary Examiner—Steven Mottola
Attorney, Agent, or Firm—Edward B. Anderson

[57]     ABSTRACT

A microwave-frequency feedback amplifier circuit has a cascode amplifier with a first field-effect transistor (FET) having a gate for receiving a signal to be amplified, a source coupled to a reference voltage, and a drain. A second FET has a source coupled to the drain of the first FET, a source coupled to the reference voltage, and a drain. A transformer includes a first inductor with a first terminal coupled to the drain of the second FET and a second terminal for outputting an amplified input signal. A second inductor has a first terminal coupled to the second terminal of the first inductor, and a second terminal coupled to the reference voltage. A feedback circuit couples the drain of the second FET to the gate of the first FET.

9 Claims, 2 Drawing Sheets

FEEDBACK CASCODE AMPLIFIER

FIELD OF THE INVENTION

This invention relates to microwave-frequency amplifiers, and in particular to feedback cascode amplifiers with a transformer coupled output.

BACKGROUND OF THE INVENTION

Conventional microwave amplifiers use an FET with a common source. The input signal is applied to the gate and the amplified signal is output on the drain. Since feedback is from the output of the common source stage, a low impedance point, a low feedback resistance value must be used. The feedback resistor is usually about 150Ω to 200Ω. This results in increased feedback, and therefore reduced gain and output power. Additionally, the noise figure of the amplifier is higher than would exist if a higher feedback resistance value is used.

As is described in Vendelin et al., *Microwave Circuit Design Using Linear and Nonlinear Techniques*, John-Wiley & Sons, 1990, pp. 250, 252, cascade circuits using bipolar transistors and resistive feedback with an output transformer are known. Such circuit is operable only at comparatively low frequencies, is subject to the higher output impedance of the bipolar transistors, requiring large impedance transformation at the output, and will not have the desired operation with the feedback resistor connected to the collector of the common-base transistor.

There is therefore a need for a monolithic microwave integrated single-stage amplifier circuit having a low noise figure, improved gain and increased power output.

SUMMARY OF THE INVENTION

These features are provided in the present invention by a single-stage, feedback cascode amplifier. This configuration allows the use of higher feedback impedance. A circuit made according to the invention correspondingly has a lower noise figure, higher gain, and greater output power.

Generally, the invention provides a microwave-frequency feedback amplifier circuit having a cascode amplifier. The cascode amplifier includes a first field-effect transistor (FET) having a gate for receiving a signal to be amplified, a source coupled to a reference voltage, and a drain. A second FET has a source coupled to the drain of the first FET, a source coupled to the reference voltage, and a drain.

A first inductor has a first terminal coupled to the drain of the second FET and a second terminal for outputting an amplified input signal. A second inductor has a first terminal coupled to the second terminal of the first inductor, and a second terminal coupled to the reference voltage.

A feedback circuit couples the drain of the second FET to the gate of the first FET.

In the preferred embodiment of the invention, the feedback circuit has a resistance of greater than 600Ω and a mutually-coupled transformer on the drain of the common-gate FET. Feedback also exists between the gate of the common-gate FET and the second inductor. The result is a single-stage amplifier with a gain of about 15 dB and good impedance matching over a low microwave-frequency range.

These and other features and advantages of the present invention will be apparent from the following detailed description of the preferred embodiment and associated drawings.

DETAILED DESCRIPTION OF THE PREFERRED EMBODIMENT

Figure 1:
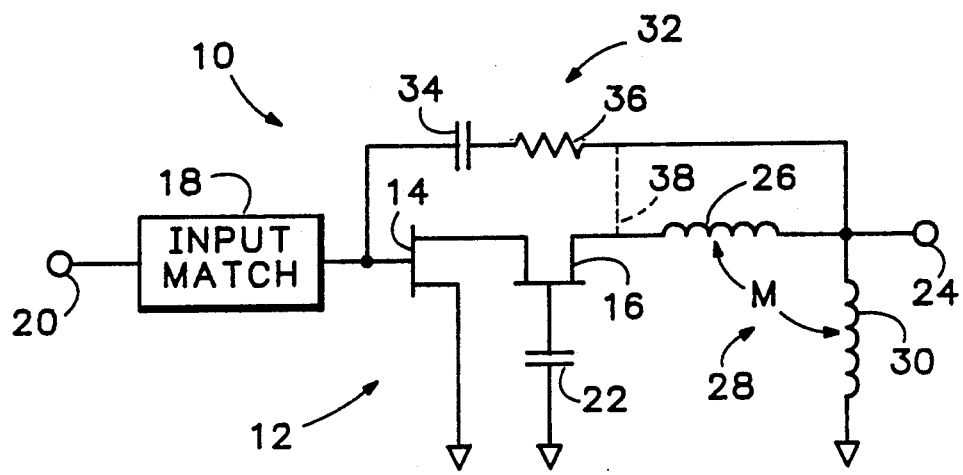
FIG. 1 is a general schematic of an amplifier made according to the invention.

Referring initially to FIG. 1, an amplifier circuit made according to the invention is shown generally at 10. Circuit 10 includes a cascade amplifier 12, having a first, common-source FET 14 and a second common-gate FET 16. An input-impedance-matching circuit 18 couples an input terminal 20 to the gate of FET 14. The gate of FET 16 is coupled to ground, or other common reference voltage, through a capacitor 22.

The drain of FET 16 is coupled to an output terminal 24 via a first winding or inductor 26 preferably of a transformer shown generally at 28. A second winding or inductor 30 of transformer 28 is coupled to ground. Windings 26 and 30 are preferably mutually coupled, for stepping down the high impedance, common-gate FET output of amplifier 12 to a desired level, such as 50Ω.

The output is fed back to the gate of first FET 14 via a feedback circuit 32 including a capacitor 34 and resistor 36. Optionally, the feedback circuit may be directly connected to the drain of FET 16, as shown by dotted line 38.

Figure 2:
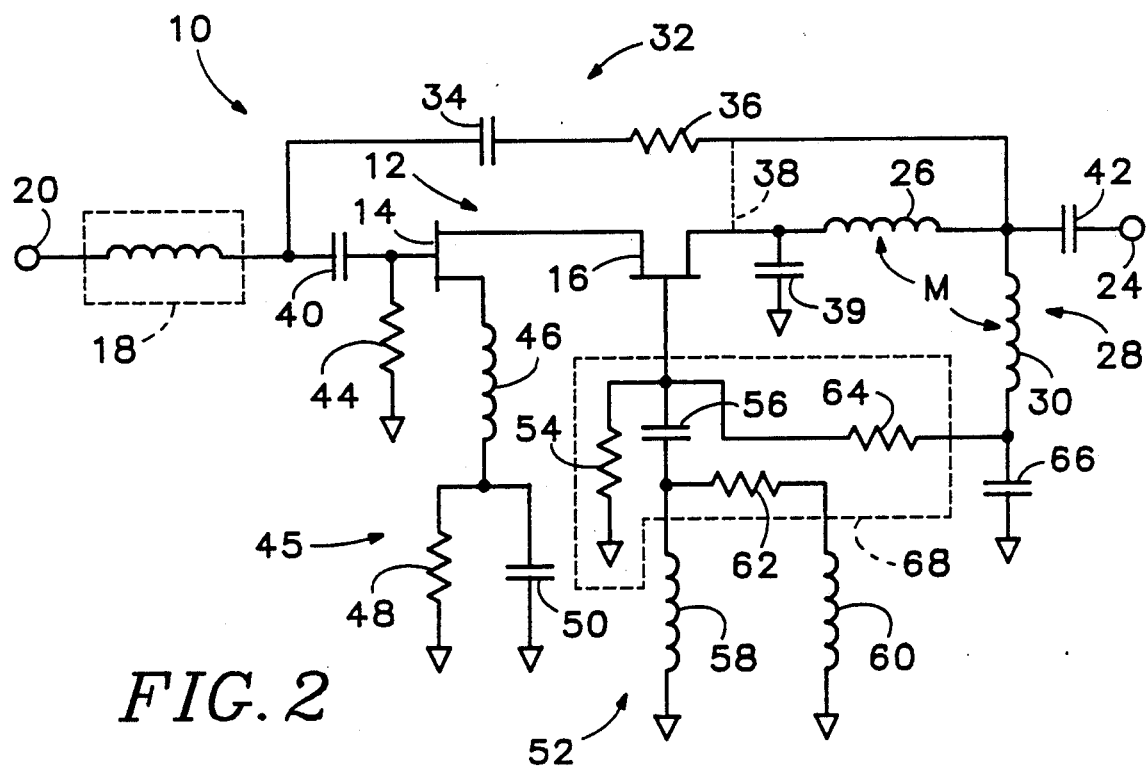
FIG. 2 is a detailed schematic of the amplifier of FIG. 1.

This basic circuit has been found to provide improved gain while keeping the circuit noise figure low. A detailed schematic of circuit 10, constructed as an integrated circuit (IC), is shown in FIG. 2. The main signal and feedback paths of this circuit are substantially as shown in FIG. 1, except for input and output DC-blocking capacitors (10 pf) 40 and 42, respectively, and a 2.5 kΩ resistor 44 coupling the gate of FET 14 to ground. A capacitor 39 may be added to cause gain peaking for a narrow frequency band. Input impedance-matching circuit 18 comprises a 5.28 nH inductor provided by input bond wire on the IC. Feedback capacitor 34 preferably has a value of 3 pf and resistor 36 preferably has a value of more than 600Ω, such as 625Ω.

Additionally, the source of FET 14 is coupled to ground through an impedance circuit 45 comprising an inductor 46 in series with the parallel combination of a 27Ω resistor 48 and a capacitor 50.

The gate of FET 16 is coupled to ground through an impedance circuit 52 comprising a 2 kΩ resistor 54 in parallel with the combination of a 5 pf capacitor 56 in series with the parallel combination of two inherent inductances 58 and 60. These inductances result from bond wires or via holes used on the chip embodying amplifier 10. Inductance 60 is in series with a 5Ω resistor 62.

The gate of FET 16 is also connected to the ground side of inductor 30 via a 6 kΩ resistor 64. The ground side of inductor 30 is coupled to ground via a 100 pf capacitor 66.

GaAs MESFETs 14 and 16 are presumed to have substantially equal pinch-off voltages. If FET 16 is selected to have a higher pinch-off voltage than FET 14, the gate of FET 16 may be directly grounded, eliminating the components contained in dashed box 68. This allows the circuit to be constructed on a smaller chip while achieving substantially the same performance.

Inductors 26 and 28 are preferably constructed of a single, planar coil to have respective inductances of 5 nH and 19.37 nH, and a mutual inductance of 4.59 nH. This results in a coefficient of coupling of 0.46.

Figure 3:
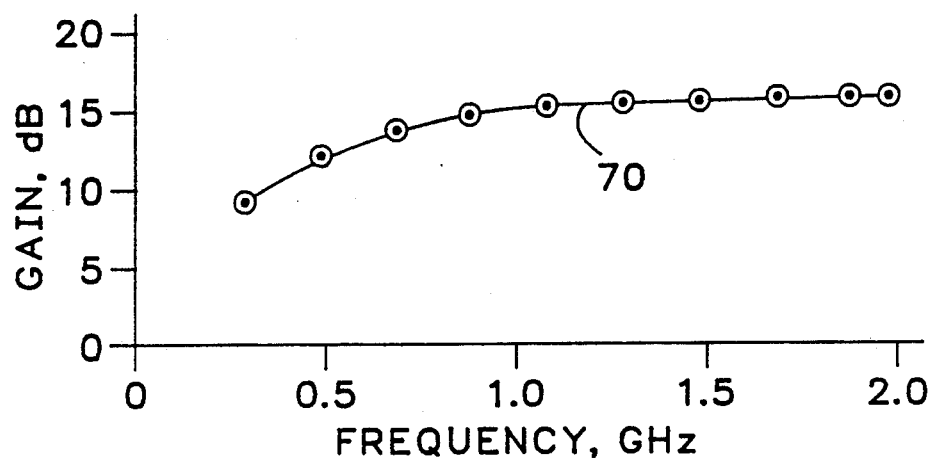
FIG. 3 is a graph of the gain of the circuit of FIG. 2.
Figure 4:
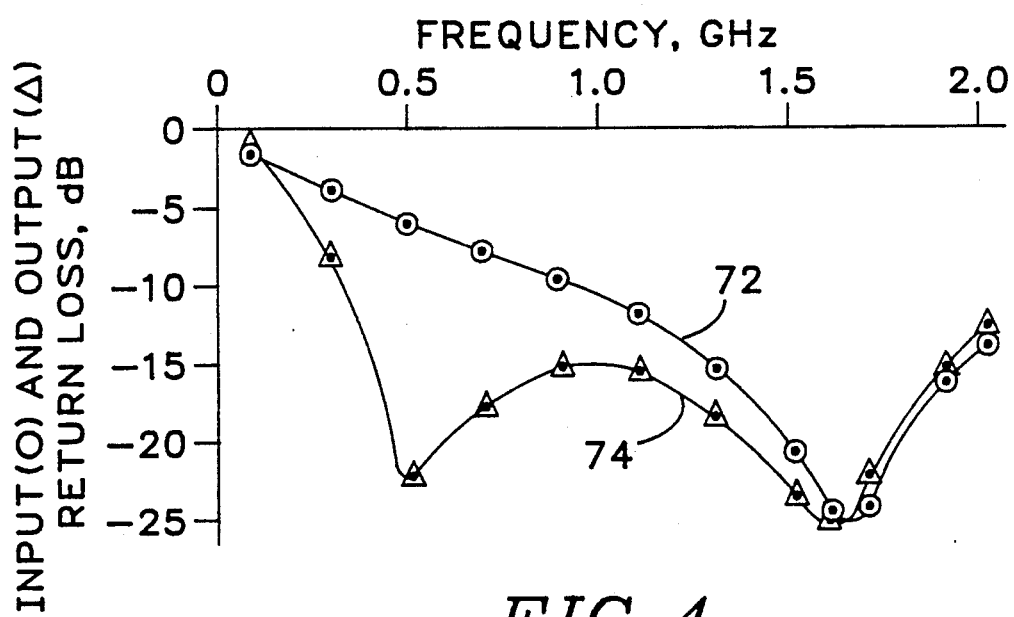
FIG. 4 is a graph of the return loss of the circuit of FIG. 2.

When constructed as a monolithic microwave integrated circuit, amplifier circuit 10 has a gain of approximately 15 dB, as shown by curve 70 in FIG. 3 over a frequency range of 0.5–2 GHz. The frequency of operation of this circuit is as high as 3 GHz, and can be extended up to 18 GHz. It has a measured noise figure of 2.0 dB and a 1-dB compression point of 14–15 dBm. Referring to FIG. 4, the input return loss, shown by curve 72, is less than 10 dB, and the output return loss, shown by curve 74, is less than 15 dB over most of the frequency range shown.

It will be apparent to one skilled in the art that variations in form and detail may be made in the preferred embodiment without varying from the spirit and scope of the invention as defined in the claims. For instance, the feedback circuit can feed back directly from the drain of the common-gate FET. Different feedback resistor values can be used to achieve different gain levels and noise figures. The size and coupling coefficient of transformer 28 can be varied. Different grounding impedances can be used depending on the FET structure and design frequency range. The preferred embodiment is thus provided for purposes of explanation and illustration, but not limitation.

We claim:

1. A microwave-frequency feedback cascode amplifier comprising:
   cascode amplifier means comprising a first field-effect transistor means (FET) having a gate for receiving a signal to be amplified, a source coupled to a reference voltage, and a drain; and a second FET having a source coupled to the drain of the first FET, a gate coupled to the reference voltage, and a drain;
   first inductance means having a first terminal coupled to the drain of the second FET, a second terminal for outputting an amplified input signal;
   second inductance means having a first terminal coupled to the second terminal of the first inductance means, and a second terminal coupled to the reference voltage; and
   feedback means coupling the drain of the second FET to the gate of the first FET means.

2. An amplifier according to claim 1 wherein the first and second inductance means are mutually coupled.

3. An amplifier according to claim 2 wherein the drain of the second FET is coupled to the feedback means through the first inductance means.

4. An amplifier according to claim 3 wherein the feedback means comprises first resistor means of greater than 600 ohms.

5. An amplifier according to claim 4 further comprising first resistance means coupling the second terminal of the second inductance means to the reference voltage, impedance means coupling the gate of the second FET to the reference voltage, and second resistance means coupling the gate of the second FET to the second terminal of the second inductance means.

6. An amplifier according to claim 1 wherein the drain of the second FET is coupled to the feedback means through the first inductance means.

7. An amplifier according to claim 1 wherein the feedback means comprises first resistor means of greater than 600 ohms.

8. An amplifier according to claim 1 wherein both FETs have substantially the same pinch-off voltage and the amplifier further comprises first resistance means coupling the second terminal of the second inductance means to the reference voltage, impedance means coupling the gate of the second FET to the reference voltage, and second resistance means coupling the gate of the second FET to the second terminal of the second inductance means.

9. An amplifier according to claim 1 wherein the second FET has a higher pinch-off voltage than the first FET, and the gate of the second FET is coupled directly to ground.

* * * * *